(12) United States Patent
Zhou et al.

(10) Patent No.: US 11,815,577 B2
(45) Date of Patent: Nov. 14, 2023

(54) PARALLEL MR IMAGING USING WAVE-ENCODING

(71) Applicant: KONINKLIJKE PHILIPS N.V., Eindhoven (NL)

(72) Inventors: Zechen Zhou, Eindhoven (NL); Peter Bornert, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 143 days.

(21) Appl. No.: 17/432,921

(22) PCT Filed: Feb. 18, 2020

(86) PCT No.: PCT/EP2020/054159
§ 371 (c)(1),
(2) Date: Aug. 21, 2021

(87) PCT Pub. No.: WO2020/173749
PCT Pub. Date: Sep. 3, 2020

(65) Prior Publication Data
US 2022/0155396 A1    May 19, 2022

Related U.S. Application Data

(60) Provisional application No. 62/809,779, filed on Feb. 25, 2019.

(30) Foreign Application Priority Data

Apr. 23, 2019 (EP) .................................... 19170549

(51) Int. Cl.
*G01V 3/00* (2006.01)
*G01R 33/483* (2006.01)
(Continued)

(52) U.S. Cl.
CPC ...... *G01R 33/4835* (2013.01); *G01R 33/5611* (2013.01); *G01R 33/56563* (2013.01)

(58) Field of Classification Search
CPC .............. G01R 33/3415; G01R 33/543; G01R 33/5659; G01R 33/36; A61B 5/055
(Continued)

(56) References Cited

U.S. PATENT DOCUMENTS

2006/0247515 A1    11/2006  Moriguchi et al.
2009/0028411 A1*   1/2009   Pfeuffer ........... G01R 33/56509
                                                          324/307

FOREIGN PATENT DOCUMENTS

CN    104714199 A  *  6/2015  ......... G01R 33/5611
CN    105473067 A  *  4/2016  ......... G01R 33/3854
(Continued)

OTHER PUBLICATIONS

Bilgic B, Gagoski BA, Cauley SF, Fan AP, Polimeni JR, Grant PE, Wald LL, Setsompop K. "Wave-CAIPI for highly accelerated 3D imaging" Magn Reson Med. 2015;73(6):2152-62.
(Continued)

*Primary Examiner* — Walter L Lindsay, Jr.
*Assistant Examiner* — Frederick Wenderoth

(57) ABSTRACT

The invention relates to a method of MR imaging of an object (10) placed in an examination volume of a MR device (1). The method comprises the steps of: —generating MR signals by subjecting the object to an imaging sequence, —acquiring MR signal profiles in a Cartesian k-space sampling scheme, wherein each MR signal profile is acquired in the presence of a temporally constant magnetic field gradient along a readout direction and a sinusoidally modulated magnetic field gradient along a phase encoding direction, and—reconstructing an MR image from the acquired MR signal profiles taking the modulation scheme of the magnetic field gradients into account. The invention proposes that the frequency of the sinusoidal modulation of the magnetic field gradient is varied during acquisition of each MR signal profile. Moreover, the invention relates to a MR device for carrying out this method as well as to a computer program to be run on a MR device.

17 Claims, 4 Drawing Sheets

(51) Int. Cl.
   *G01R 33/561* (2006.01)
   *G01R 33/565* (2006.01)
(58) Field of Classification Search
   USPC .......................................................... 324/309
   See application file for complete search history.

(56) References Cited

FOREIGN PATENT DOCUMENTS

| DE | 102013100349 A1 * | 7/2014 | ......... G01R 33/4818 |
|---|---|---|---|
| WO | WO-2015036340 A1 * | 3/2015 | ........... G01R 33/246 |

OTHER PUBLICATIONS

Polak D, Setsompop K, Cauley SF, Gagoski BA, Bhat H, Maier F, Bachert P, Wald LL, Bilgic B. Wave-CAIPI for highly accelerated MP-RAGE imaging. Magn Reson Med. Jan. 2018;79(1):401-406.
Chen F, Zhang T, Cheng JY, Shi X, Pauly JM, Vasanawala SS. "Autocalibrating motion-corrected wave-encoding for highly accelerated free breathing abdominal MRI" Magn Reson Med. 2017;78(5):1757-1766.
Gagoski BA, Bilgic B, Eichner C, Bhat H, Grant PE, Wald LL, Setsompop K. "RARE/turbo spin echo imaging with Simultaneous Multislice Wave-CAIPI" Magn Reson Med. 2015;73(3):929-38.
Poser BA, Bilgic B, Gagoski BA, Uludag K, Stenger VA, Wald LL, "Setsompop K. Echo-Planar Imaging with Wave-CAIPI Acquisition and Reconstruction" ISMRM 2017. p. 1198.
Polak D, Cauley S, Huang S, Longo M, Bilgic B, Raithel E, Wald L, Setsompop K. "Highly-accelerated volumetric brain protocol using optimized Wave-CAIPI encoding" ISMRM 2018. p. 0937.
Larkman et al "Use of multicoil arrays for separation of signal from multiple slices simultaneously excited" Journal of Magnetic Resonance Imaging 13, p. 313-317 2001.
Breuer et al "Controlled aliasing in parallel imaging results in higher acceleration (CAIPIRINHA) for multi-slice imaging" Magnetic Resonance in Med. 53 p. 684-691 2005.
Schwarz et al "Grappa Reconstructed Wave-CAIPI MP-RAGE at 7 Tesla" Magnetic Resonance in Med. vol. 80, No. 6 Apr. 16, 2018.
International Search Report and Written Opinion from PCT/EP2020/054159 dated Sep. 2, 2020.
Hoge RD, Kwan RK, Pike GB. Density compensation functions for spiral MRI. Magn Reson Med. Jul. 1997;38(1):117-28. doi: 10.1002/mrm.1910380117. PMID: 9211387.

* cited by examiner

PARALLEL MR IMAGING USING WAVE-ENCODING

CROSS REFERENCE TO RELATED APPLICATIONS

This application is a U.S. national phase application of International Application No. PCT/EP2020/054159 filed on Feb. 18, 2020, which claims the benefit of EP Application Serial No. 19170549.0 filed on Apr. 23, 2019 and U.S. Provisional Application Ser. No. 62/809,779 filed Feb. 25, 2019 and is incorporated herein by reference.

FIELD OF THE INVENTION

The invention relates to the field of magnetic resonance (MR) imaging. It concerns a method of MR imaging of an object. The invention also relates to a MR device and to a computer program to be run on a MR device.

BACKGROUND OF THE INVENTION

Image-forming MR methods which utilize the interaction between magnetic fields and nuclear spins in order to form two-dimensional or three-dimensional images are widely used nowadays, notably in the field of medical diagnostics, because for imaging of soft tissue they are superior to other imaging methods in many respects, do not require ionizing radiation and are usually not invasive.

According to the MR method in general, the object, for example the body of the patient to be examined, is arranged in a strong, uniform magnetic field whose direction at the same time defines an axis (normally the z-axis) of the co-ordinate system on which the measurement is based. The magnetic field produces different energy levels for the individual nuclear spins in dependence on the magnetic field strength which can be excited (spin resonance) by application of an electromagnetic alternating field (RF field) of defined frequency (so-called Larmor frequency, or MR frequency). From a macroscopic point of view the distribution of the individual nuclear spins produces an overall magnetization which can be deflected out of the state of equilibrium by application of an electromagnetic pulse of appropriate frequency (RF pulse), so that the magnetization performs a precessional motion about the z-axis. The precessional motion describes a surface of a cone whose angle of aperture is referred to as flip angle. The magnitude of the flip angle is dependent on the strength and the duration of the applied electromagnetic pulse. In the case of a so-called 90° pulse, the spins are deflected from the z axis to the transverse plane (flip angle 90°).

After termination of the RF pulse, the magnetization relaxes back to the original state of equilibrium, in which the magnetization in the z direction is built up again with a first time constant $T_1$ (spin lattice or longitudinal relaxation time), and the magnetization in the direction perpendicular to the z direction relaxes with a second time constant $T_2$ (spin-spin or transverse relaxation time). The variation of the magnetization can be detected by means of receiving RF coils which are arranged and oriented within an examination volume of the MR device in such a manner that the variation of the magnetization is measured in the direction perpendicular to the z-axis. The decay of the transverse magnetization is accompanied, after application of, for example, a 90° pulse, by a transition of the nuclear spins (induced by local magnetic field inhomogeneities) from an ordered state with the same phase to a state in which all phase angles are uniformly distributed (dephasing). The dephasing can be compensated by means of a refocusing pulse (for example a 180° pulse). This produces an echo signal (spin echo) in the receiving coils.

To realize spatial resolution in the body, magnetic field gradients extending along the three main axes are superposed on the uniform magnetic field, leading to a spatial dependency of the spin resonance frequency. The signal picked up in the receiving coils then contains components of different frequencies which can be associated with different locations in the body. The signal data obtained via the receiving coils corresponds to the spatial frequency domain and is called k-space data. The k-space data usually includes multiple lines (also referred to as profiles) acquired with different phase encoding. Each line is digitized by collecting a number of samples. A set of k-space data is converted to a MR image by means of an image reconstruction algorithm.

Recently, techniques for accelerating MR acquisition have been developed which are called parallel acquisition. Methods in this category are SENSE (Sensitivity Encoding), SMASH (Simultaneous Acquisition of Spatial Harmonics), and GRAPPA (Generalized Auto-calibrating Partially Parallel Acquisition). SENSE, SMASH, and GRAPPA and other parallel acquisition techniques use subsampled k-space data acquisition obtained from multiple RF receiving coils in parallel. In these methods, the (complex) signal data from the multiple coils are combined with complex weightings in such a way as to suppress subsampling artifacts (aliasing) in the finally reconstructed MR images. This type of complex array signal combination is sometimes referred to as spatial filtering, and includes combining which is performed in the k-space domain (as in SMASH and GRAPPA) or in the image domain (as in SENSE), as well as methods which are hybrids.

Larkman et al. (Journal of Magnetic Resonance Imaging, 13, 313-317, 2001) proposed to apply sensitivity encoding also in the slice direction in case of multi-slice imaging to increase scan efficiency. Breuer et al. (Magnetic Resonance in Medicine, 53, 684-691, 2005) improved this basic idea proposing an approach termed "controlled aliasing in parallel imaging results in higher acceleration" (CAIPIRINHA or just CAIPI). This technique modifies the appearance of aliasing artifacts in each individual slice during the multi-slice acquisition improving the subsequent parallel image reconstruction procedure. Thus, CAIPI is a parallel multi-slice imaging technique which is more efficient compared to other multi-slice parallel imaging concepts that use only a pure post-processing approach. In CAIPI, multiple slices of arbitrary thickness and distance are excited simultaneously with the use of phase-modulated multi-slice RF pulses (similar to the known Hadamard pulses). The acquired MR signal data are subsampled, yielding superimposed slice images that appear shifted with respect to each other. The shift of the aliased slice images is controlled by the phase-modulation scheme of the RF pulses in accordance with the Fourier shift theorem. From phase-encoding step to phase-encoding step, the multi-slice RF pulses apply an individual phase shift to the MR signals of each slice. The numerical conditioning of the inverse reconstruction problem, separating the individual signal contributions of the involved slices, is improved by using this shift. CAIPI has the potential to improve the separation of the superimposed slice images also in cases in which the slices are rather close to each other such that the coil sensitivities of the used RF receiving coils do not differ dramatically in the individual slices to be imaged. However, CAIPI has limitations.

As a further improvement of the known CAIPI method, the so-called Wave-CAIPI method has been proposed for highly accelerated 3D imaging with negligible geometry factor and a low artifact level (see, e.g., Berkin Bilgic et al., Magn. Reson. Med. 2015, 73(6), 2152-2162). The Wave-CAIPI method involves the generation of sinusoidally modulated magnetic field gradients (GY, GZ) along the phase and slice encoding directions during the readout of each $k_x$-encoding profile. The resulting acquisition spreads the aliasing evenly in all spatial directions, thereby taking full advantage of the three-dimensional coil sensitivity profiles for accelerated parallel imaging with a high level of subsampling. It has been shown that the voxel spreading effect of the gradient modulation corresponds to a convolution with a (transformed) point spread function in image space such that an efficient reconstruction scheme can be used that does not require data gridding.

SUMMARY OF THE INVENTION

In accordance with the invention, a method of MR imaging of an object placed in an examination volume of a MR device is disclosed. The method comprises the steps of:
  generating MR signals by subjecting the object to an imaging sequence,
  acquiring MR signal profiles in a Cartesian k-space sampling scheme, wherein each MR signal profile is acquired in the presence of a temporally constant magnetic field gradient along a readout direction and a sinusoidally modulated magnetic field gradient along a phase encoding direction, and
  reconstructing an MR image taking the modulation scheme of the magnetic field gradient into account. The invention proposes that the frequency of the sinusoidal modulation of the magnetic field gradient is varied during acquisition of each MR signal profile.

The technique of the invention generally corresponds to the known Wave-CAIPI approach. According to the invention, however, a variable frequency modulated wave encoding k-space trajectory is proposed to further improve the aliasing propagation along the readout direction, to reduce potential eddy current related adverse effects and to reduce the side lobes of the (transformed) point spread function (PSF). Known optimization strategies for the Wave-CAIPI technique have demonstrated that larger amplitudes of the wave encoding magnetic field gradients play an important role to improve the aliasing spreading effect and to reduce the geometry factor in comparison to adjusting the number of cycles of the gradient modulation (see Polak et al., ISMRM 2018, p. 0937). However, the PSF of conventional constant frequency wave encoding still follows a distribution with large oscillations along the readout direction and with large amplitude side lobes. In addition, increasing the magnetic field gradient amplitude introduces eddy current issues, in particular along the direction in which the wave encoding gradient stops with a large amplitude at the end of the acquisition interval of each MR signal profile (e.g. in the case of a cosine shaped gradient waveform). These residual eddy currents will further adversely influence the RF slice selection profile resulting in local image artifacts and global signal intensity loss. Such artifacts and further problems associated with constant amplitude and/or constant frequency wave encoding are overcome by the invention.

The imaging sequence applied according to the invention can be any conventional two- or three-dimensional imaging sequence, or a multi-dimensional extension, such as a spatial-temporal (time-resolved) imaging sequence. The imaging sequence can be a two-dimensional, three-dimensional or higher-dimensional spin echo sequence, preferably a turbo spin echo sequence. The method of the invention can also be applied in combination with a two-dimensional, three-dimensional or higher-dimensional gradient echo sequence, preferably a turbo field echo sequence. Higher dimensions can include a spectral dimension or, as mentioned, a time dimension. The sequence may be designer to explore chemical shift (e.g. water/fat separation), relaxation time ($T_1$, $T_2$, $T_2^*$), respiration-state, cardiac cycle, b-values and directions, diffusion etc. In the two-dimensional case, the implementation of the invention with magnetic field gradient modulation is equivalent to the known Bunch encoding (BPE) technique.

In a preferred embodiment of the invention, the instantaneous frequency of the sinusoidal modulation of the magnetic field gradient is increasing during the first half of the acquisition time interval of each MR signal profile and decreasing back to its initial value during the second half of the acquisition time interval. In this (mirror-like) frequency variation scheme, the corkscrew shaped readout trajectory rotates more frequently in the proximity of central k-space and behaves oppositely when approaching the peripheral k-space. In this way, the k-space sampling spacing is varying along the readout direction which mimics a variable density sampling to spread subsampling-induced aliasing more evenly while reducing the maximum side lobes of the PSF.

In a further preferred embodiment, the amplitude of the magnetic field gradient modulation is varied during the acquisition of the MR signals. The amplitude can be modulated, e.g., to be minimal at the start and at the end of the acquisition time interval of each MR signal profile. The additional amplitude modulation for the wave encoding gradient waveform can be employed to reduce eddy currents and, thus, to improve the slice selection profile.

In accordance with a preferred embodiment of the invention, the MR signals are acquired with subsampling in the in-plane direction of the image slices. The MR images of the image slices can be reconstructed in this case by using a per se known parallel image reconstruction algorithm, like SENSE, SMASH or GRAPPA.

The method of the invention described thus far can be carried out by means of a MR device including at least one main magnet coil for generating a uniform static magnetic field within an examination volume, a number of gradient coils for generating switched magnetic field gradients in different spatial directions within the examination volume, a set of RF coils for receiving MR signals from the body, a control unit for controlling the temporal succession of RF pulses and switched magnetic field gradients, and a reconstruction unit. The method of the invention can be implemented, for example, by a corresponding programming of the reconstruction unit and/or the control unit of the MR device.

The method of the invention can be advantageously carried out in most MR devices in clinical use at present. To this end it is merely necessary to utilize a computer program by which the MR device is controlled such that it performs the above-explained method steps of the invention. The computer program may be present either on a data carrier or be present in a data network so as to be downloaded for installation in the control unit of the MR device.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF THE EMBODIMENTS

Figure 1:
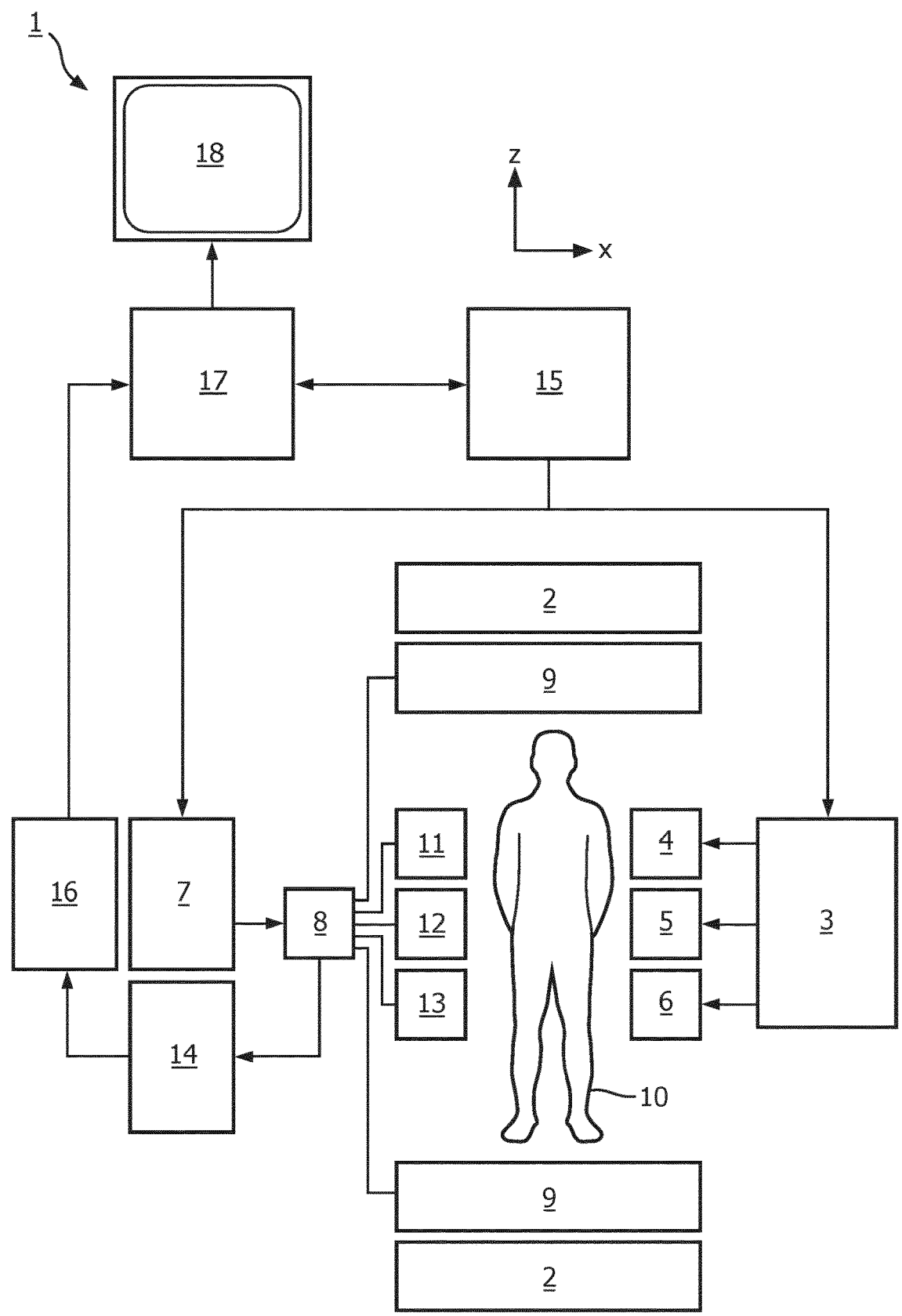
FIG. 1 shows a MR device for carrying out the method of the invention.

With reference to FIG. 1, a MR device 1 is shown. The device comprises superconducting or resistive main magnet coils 2 such that a substantially uniform, temporally constant main magnetic field is created along a z-axis through an examination volume.

A magnetic resonance generation and manipulation system applies a series of RF pulses and switched magnetic field gradients to invert or excite nuclear magnetic spins, induce magnetic resonance, refocus magnetic resonance, manipulate magnetic resonance, spatially and otherwise encode the magnetic resonance, saturate spins, and the like to perform MR imaging.

More specifically, a gradient pulse amplifier 3 applies current pulses to selected ones of whole-body gradient coils 4, 5 and 6 along x, y and z-axes of the examination volume. A digital RF frequency transmitter 7 transmits RF pulses or pulse packets, via a send-/receive switch 8, to a whole-body volume RF coil 9 to transmit RF pulses into the examination volume. A typical MR imaging sequence is composed of a packet of RF pulse segments of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 10 positioned in the examination volume.

For generation of MR images of limited regions of the body 10 by means of parallel imaging, a set of local RF coils 11, 12, 13 are placed contiguous to the region selected for imaging.

The resultant MR signals are picked up by the RF coils 11, 12, 13 and demodulated by a receiver 14 preferably including a preamplifier (not shown). The receiver 14 is connected to the RF coils 9, 11, 12 and 13 via send-/receive switch 8.

A host computer 15 controls the gradient pulse amplifier 3 and the transmitter 7 to generate any of a plurality of MR imaging sequences, such as echo planar imaging (EPI), echo volume imaging, gradient and spin echo imaging, fast spin echo imaging, and the like. For the selected sequence, the receiver 14 receives a single or a plurality of MR data lines in rapid succession following each RF excitation pulse. A data acquisition system 16 performs analog-to-digital conversion of the received signals and converts each MR data line to a digital format suitable for further processing. In modern MR devices the data acquisition system 16 is a separate computer which is specialized in acquisition of raw image data.

Ultimately, the digital raw image data is reconstructed into an image representation by a reconstruction processor 17 which applies a Fourier transform or other appropriate reconstruction algorithms. The MR image may represent a planar slice through the patient, an array of parallel planar slices, a three-dimensional volume, or the like. The image is then stored in an image memory where it may be accessed for converting slices, projections, or other portions of the image representation into appropriate format for visualization, for example via a video monitor 18 which provides a man-readable display of the resultant MR image.

Figure 2:
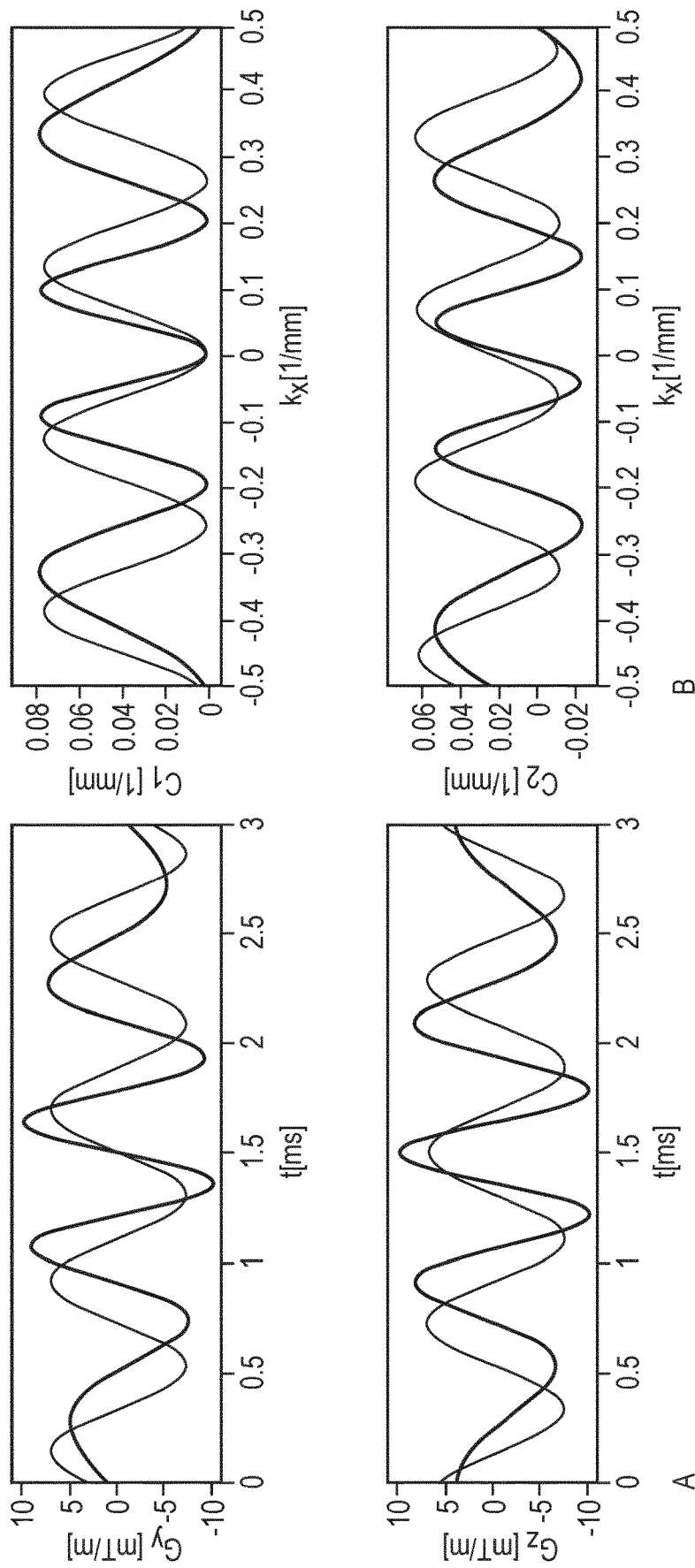
FIG. 2 shows diagrams illustrating variable frequency Wave-CAIPI gradient waveforms according to the invention in comparison to conventional constant frequency Wave-CAIPI gradient waveforms.
Figure 3:
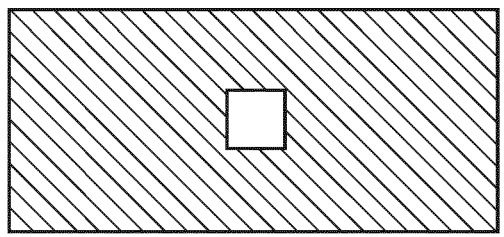
FIG. 3 shows a comparison of the point spread function PSF for constant frequency Wave-CAIPI and variable frequency Wave-CAIPI according to the invention.
Figure 3:
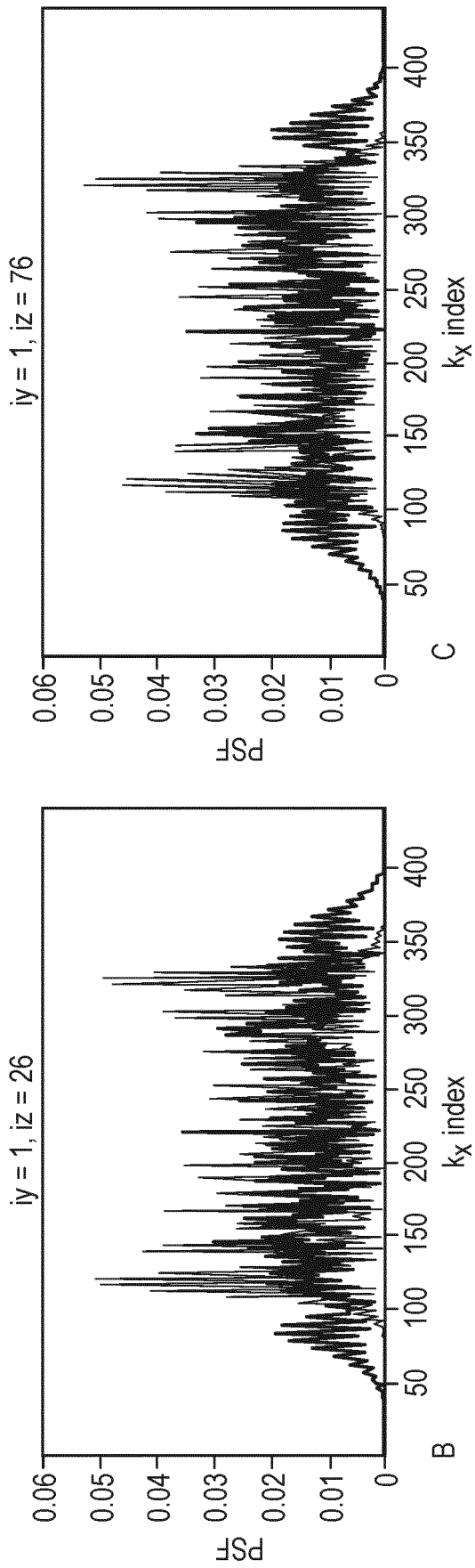
Figure 4:
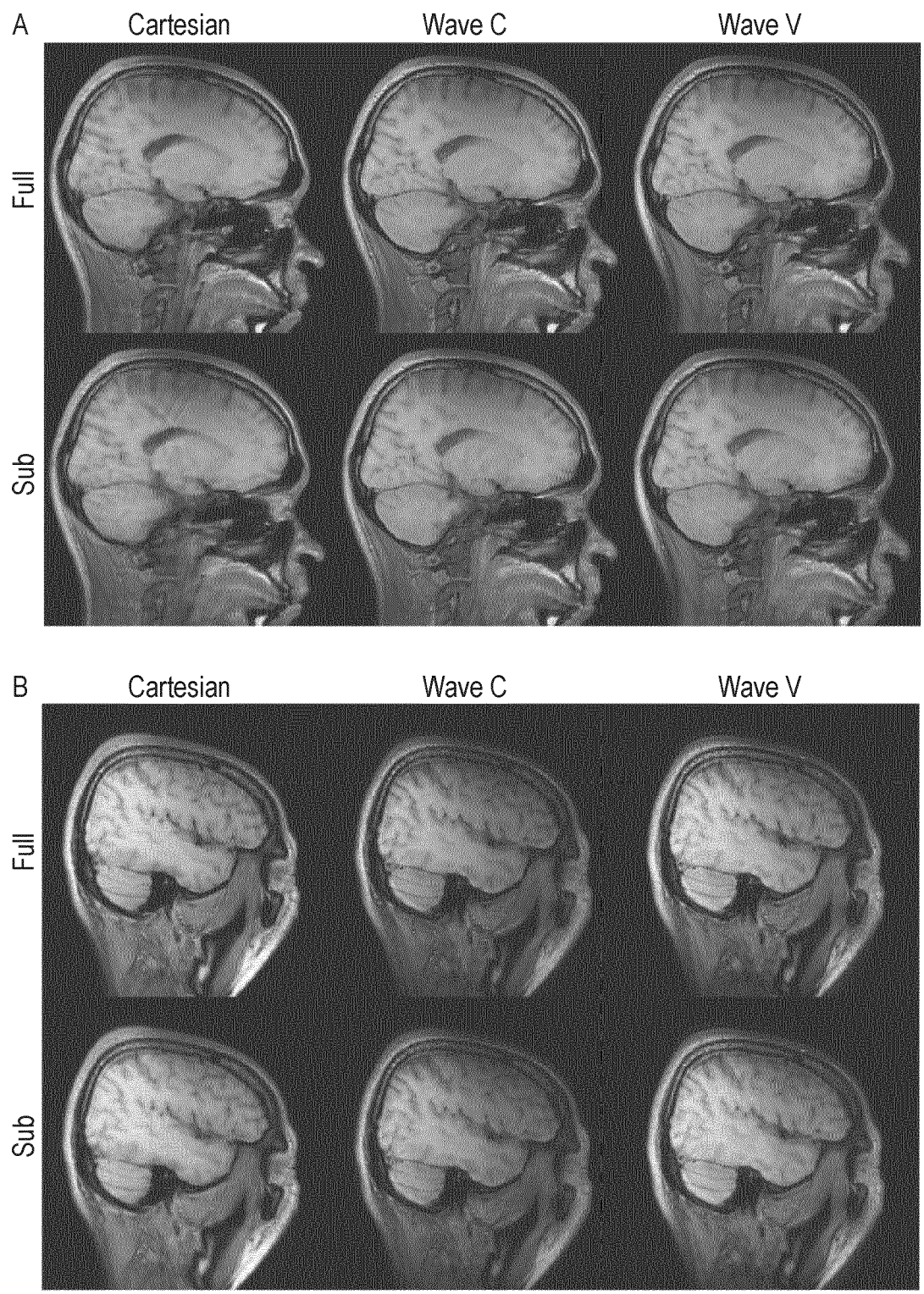
FIG. 4 shows central and lateral slices of a three-dimensional brain scan comparing conventional Cartesian sampling with constant frequency Wave-CAIPI and variable frequency Wave-CAIPI according to the invention.

With continuing reference to FIG. 1 and with further reference to FIGS. 2-4 the imaging approach of the invention is explained.

According to the invention, an imaging sequence (for example a spin-echo sequence, like the known TSE sequence) is applied. MR signals are received in parallel via the RF coils 11, 12, 13 having different spatial sensitivities. MR signal profiles are acquired in a Cartesian k-space scheme with subsampling in the phase encoding directions. According to the Wave-CAIPI technique, each MR signal profile is acquired in the presence of a temporally constant magnetic field gradient along the readout direction and sinusoidally modulated magnetic field gradients along the phase encoding directions. In other words, the MR signal acquisition is a superposition of a Cartesian readout employing a linear readout magnetic field gradient $G_x$ with sinusoidally varying magnetic field gradients along the phase encoding directions $G_y$ and $G_z$.

According to the invention, the frequency of the sinusoidal modulation of the magnetic field gradients is varied during acquisition of each MR signal profile. The instantaneous frequency of the magnetic field gradient modulation can be generally defined as $f(t)=f_c+h(t)$, $t\in [0,T_{acq}]$, where $f_c$ and $h(t)$ correspond to the constant frequency component and time-varying frequency component respectively. $h(t)$ can be any kind of symmetric, asymmetric, piecewise linear and nonlinear function. In an embodiment of the invention, a symmetric and nonlinear function is used to modulate the instantaneous frequency, namely $f(t)=f_c-2\pi f_m \beta \cos(2\pi f_m t)$, where parameter $f_m$ and $\beta$ control the frequency varying pattern and waveform shape respectively. Typically, $f_m=1/T_{acq}$ is chosen to achieve a monotonous increasing or decreasing property during the first or second half of the acquisition time interval $T_{acq}$, while $\beta$ is a tunable parameter to optimize the performance and adapt to the hardware constraints including maximum gradient strength and slew rate. With this, the wave encoding k-space trajectories ($C_1(t)$ and $C_2(t)$) and corresponding gradient waveforms ($g_y(t)$ and $g_z(t)$) can be formulated as follows:

$$\begin{cases} C_1(t) = \dfrac{\gamma}{2\pi} \dfrac{G_y}{2\pi f_c}(1 - \cos(2\pi(f_c t - \beta\sin(2\pi f_m t)))) \\ C_2(t) = \dfrac{\gamma}{2\pi} \dfrac{G_y}{2\pi f_c}\sin(2\pi(f_c t - \beta\sin(2\pi f_m t))) \end{cases}, t \in [0, T_{acq}],$$

$$\begin{cases} g_y(t) = G_y\left(1 - 2\pi\dfrac{f_m}{f_c}\beta\cos(2\pi f_m t)\right)\sin(2\pi(f_c t - \beta\sin(2\pi f_m t))) \\ g_z(t) = G_z\left(1 - 2\pi\dfrac{f_m}{f_c}\beta\cos(2\pi f_m t)\right)\cos(2\pi(f_c t - \beta\sin(2\pi f_m t))) \end{cases},$$

$$t \in [0, T_{acq}],$$

where $G_y$ and $G_z$ indicate the maximum gradient amplitude along the y- and z-direction respectively. The above ideal gradient waveforms may be corrected for effects of the gradient modulation transfer function (i.e. eddy current compensation) and then applied in the MR scan. Also, additional pre-phasing and re-winding gradients may be applied to maintain the Carr-Purcell-Meiboom-Gill (CPMG) condition for the 3D TSE scan.

For MR image reconstruction it is exploited that the encoding created by the sinusoidal gradients $G_y$ and $G_z$ can be captured through a separable point spread function (PSF). Each MR signal profile in the underlying three-dimensional image is convolved with the PSF that depends on the spatial position in the y- and z-directions to yield the acquired MR image. In a hybrid ($k_g$, y, z) space, each $k_x$ line of the MR signal data at a given (y, z) position obtains a unique phase modulation contained in the PSF.

FIG. 2 illustrates an example implementation of the proposed variable frequency wave encoding magnetic field gradient waveform (indicated by letter V in FIG. 2) and compares it with a constant frequency wave encoding waveform (indicated by letter C). The gradient waveform is shown in FIG. 2a while the corresponding k-space trajectories are shown in FIG. 2b, each time for constant and variable frequency wave encoding schemes. The wave encoding k-space trajectories in FIG. 2b are calibrated from in vivo imaging. The corresponding gradient waveforms in FIG. 2a are simulated by numerical derivative and scaling.

With the calibrated wave encoding k-space trajectories and the employed subsampling mask, the (transformed) PSF can be synthesized. FIG. 3 shows a comparison of the PSF for constant (C) and variable frequency (V) wave encoding schemes. FIG. 3a shows the employed CAIPI subsampling mask with reduction factor 2 in both y- and z-directions and a fully sampled central area. FIGS. 3b and 3c show the resulting PSF for two different (y, z) positions. It can be seen from FIG. 3 that the variable frequency wave encoding scheme of the invention improves the aliasing propagation along the readout direction and significantly reduces the amplitude of side lobes of the PSF.

FIGS. 4a and 4b show central and lateral slices of a brain scan respectively. In the top row of FIGS. 4a and 4b (indicated by 'Full') slice images are shown that have been reconstructed from fully sampled MR signal data. A conventional Cartesian sampling scheme has been employed for the images in the left column (indicated by 'Cartesian'). Constant frequency wave encoding has been employed for the images in the middle column (indicated by 'Wave C') while variable frequency wave encoding has been employed for the images in the right column (indicated by 'Wave V'). The images in the bottom row of FIGS. 4a and 4b (indicated by 'Sub') are reconstructed from subsampled MR signal data with a reduction factor 3 in the phase encoding direction and a reduction factor 2 in the slice encoding direction. As can be seen from FIGS. 4a and 4b, for the 3×2 Wave-CAIPI in vivo brain acceleration experiment, the variable frequency wave encoding approach of the invention can provide better aliasing suppression results in both central and lateral image slices. It can clearly be seen in the bottom row of FIG. 4a that residual aliasing artifacts are reduced with variable frequency wave encoding. In addition, the variable frequency wave encoding can significantly reduce the signal loss due to eddy current induced slice profile degradation in lateral slices. A clear signal drop can clearly be seen in the middle column of FIG. 4b which is not present in the right column.

The invention claimed is:

1. A method of magnetic resonance (MR) imaging of an object placed in an examination volume of a MR device comprising a plurality of coils, the method comprising:

generating MR signals by subjecting the object to an imaging sequence using the plurality of coils;

acquiring, using the plurality of coils, MR signal profiles in a superposition of a Cartesian readout employing a linear readout magnetic field gradient and one or more sinusoidally varying magnetic field gradients along one or more phase encoding directions so that each MR signal profile is acquired in presence of a temporally constant magnetic field gradient along a readout direction and the one or more sinusoidally varying magnetic field gradients along the one or more phase encoding directions; and reconstructing, by a reconstruction processor, an MR image taking a modulation scheme of the one or more sinusoidally varying magnetic field gradients into account, wherein a frequency of modulation of the sinusoidally varying magnetic field gradients is varied during acquisition of each MR signal profile.

2. A magnetic resonance (MR) device, comprising:

at least one main magnet coil for generating a uniform, static magnetic field within an examination volume;

a plurality of gradient coils for generating switched magnetic field gradients in different spatial directions within the examination volume;

at least one or more RF coils;

a controller for controlling a temporal succession of radio frequency (RF) pulses and switched magnetic field gradients; and a reconstruction processor, wherein the MR device is arranged to:

generate MR signals by subjecting an object to an imaging sequence using the at least one main magnet coil, the plurality of gradient coils, and the one or more RF coils, acquiring, using the at least one main magnet coil, the plurality of gradient coils, and the one or more RF coils, MR signal profiles in a superposition of a Cartesian readout employing a linear readout magnetic field gradient and one or more sinusoidally varying magnetic field gradients along one or more phase encoding directions such that each MR signal profile is acquired in presence of a temporally constant magnetic field gradient along a readout direction and the one or more sinusoidally varying magnetic field gradients along the one or more phase encoding directions, and reconstructing, by the reconstruction processor, an MR image from the acquired MR signal profiles taking a modulation scheme of the one or more sinusoidally varying magnetic field gradients into account, wherein a frequency of modulation of the one or more sinusoidally varying magnetic field gradients is varied during acquisition of each MR signal profile.

3. A tangible non-transitory computer-readable storage medium that stores a computer program, wherein the computer program, when executed by a processor, causes a magnetic resonance (MR) device comprising a plurality of coils to:

generate MR signals by subjecting an object to an imaging sequence using the plurality of coils, acquire, using the plurality of coils, MR signal profiles in a superposition of a Cartesian readout employing a linear readout magnetic field gradient and one or more sinusoidally varying magnetic field gradients along one or more phase encoding directions so that each MR signal profile is acquired in presence of a temporally constant magnetic field gradient along a readout direction and the one or more sinusoidally varying magnetic field gradients along the one or more phase encoding directions, wherein the MR signals are received in parallel via a set of at least two RF coils having different spatial sensitivity profiles within an examination volume defined by the plurality of coils, and reconstruct an MR image from the acquired MR signal profiles taking a modulation scheme of the one or more sinusoidally varying magnetic field gradients into account, wherein a frequency of modulation of the one or more sinusoidally varying magnetic field gradients is varied during acquisition of each MR signal profile.

4. The method of claim 1, wherein the imaging sequence is a two-dimensional, three-dimensional or higher-dimensional spin echo sequence.

5. The method of claim 1, wherein the imaging sequence is a two-dimensional, three-dimensional or higher-dimensional gradient echo sequence.

6. The method of claim 1, wherein an instantaneous frequency of modulation of the sinusoidally varying magnetic field gradients is increasing during a first half of an acquisition time interval of each MR signal profile and decreasing back to an initial value during a second half of the acquisition time interval of each MR signal profile.

7. The method of claim 1, wherein an amplitude of the sinusoidally varying magnetic field gradients is varied during the acquisition of each MR signal profile.

8. The method of claim 1, wherein the MR signals are acquired with subsampling via at least two RF coils having different spatial sensitivity profiles, wherein the MR image is reconstructed using a parallel image reconstruction algorithm.

9. The method of claim 1, wherein the imaging sequence comprises multi-slice RF pulses for simultaneously exciting two or more spatially separate image slices, wherein MR signal contributions from different image slices are separated based on of spatial sensitivity profiles of at least two RF coils.

10. The method of claim 4, wherein the imaging sequence comprises a turbo spin echo sequence.

11. The method of claim 5, wherein the imaging sequence comprises a turbo field echo sequence.

12. The tangible non-transitory computer-readable storage medium of claim 3, wherein the imaging sequence is a two-dimensional, three-dimensional or higher-dimensional spin echo sequence.

13. The tangible non-transitory computer-readable storage medium of claim 3, wherein the imaging sequence is a two-dimensional, three-dimensional or higher-dimensional gradient echo sequence.

14. The tangible non-transitory computer-readable storage medium of claim 3, wherein an instantaneous frequency of modulation of the one or more sinusoidally varying magnetic field gradients is increasing during a first half of an acquisition time interval of each MR signal profile and decreasing back to an initial value during a second half of the acquisition time interval of each MR signal profile.

15. The tangible non-transitory computer-readable storage medium of claim 3, wherein an amplitude of the one or more sinusoidally varying magnetic field gradients is varied during the acquisition of each MR signal profile.

16. The tangible non-transitory computer-readable storage medium of claim 3, wherein the MR signals are acquired with subsampling via at least two RF coils having different spatial sensitivity profiles, wherein the MR image is reconstructed using a parallel image reconstruction algorithm.

17. The tangible non-transitory computer-readable storage medium of claim 3, wherein the imaging sequence comprises multi-slice RF pulses for simultaneously exciting two or more spatially separate image slices, wherein MR signal contributions from different image slices are separated based on of spatial sensitivity profiles of at least two RF coils.

* * * * *